United States Patent [19]
Lu et al.

[11] Patent Number: 6,100,188
[45] Date of Patent: Aug. 8, 2000

[54] STABLE AND LOW RESISTANCE METAL/BARRIER/SILICON STACK STRUCTURE AND RELATED PROCESS FOR MANUFACTURING

[75] Inventors: Jiong-Ping Lu; Ming Hwang, both of Dallas; Dick N. Anderson; Duane E. Carter, both of Plano; Wei-Yung Hsu, Dallas, all of Tex.

[73] Assignee: Texas Instruments Incorporated, Dallas, Tex.

[21] Appl. No.: 09/108,474

[22] Filed: Jul. 1, 1998

Related U.S. Application Data

[60] Provisional application No. 60/051,798, Jul. 7, 1997.

[51] Int. Cl.$^7$ .................................................. H01L 21/44
[52] U.S. Cl. ........................ 438/653; 438/656; 438/643; 438/627; 257/751
[58] Field of Search ................................ 438/653, 396, 438/656, 776, 643, 627; 257/383, 751; 204/177; 216/51

[56] References Cited

U.S. PATENT DOCUMENTS

| | | |
|---|---|---|
| 4,715,937 | 12/1987 | Moslehi et al. ........................ 438/776 |
| 5,780,908 | 7/1998 | Sekiguchi et al. ...................... 257/383 |
| 5,907,188 | 5/1999 | Nakajima et al. ...................... 438/656 |

OTHER PUBLICATIONS

Hezel et al.; "Silicon Oxynitride Films Prepared by Plasma Nitridation of Silicon and Their Application for Tunnel Metal–Insulator–Silicon Diodes"; J. Appl. Phys., vol. 56, No. 6, Sep. 1984.

1996 IEEE Transactions on Electron Devices, vol. 43, No. 11, Nov. 1996, "Low–Resistivity Poly–Metal Gate Electrode Durable for High–Temperature Processing," pp. 1864–1869 (Yasushi Akasaka; Shintaro Suehiro; Kazuaki Nakajima; Tetsuro Nakasugi; Kiyotaka Miyano; Kunihiro Kasai; Hisato Oyamatsu, Member, IEEE; Masaaki Kinugawa, Member, IEEE; Mariko Takayanagi; Kenichi Agawa; Fumitomo Matsuoka, Member, IEEE; Masakazu Kakumu, Member, IEEE; and Kyoichi Suguro).

IEEE Transactions on Electron Devices, vol. ED–31, No. 9, Sep. 1984, "A New Tungsten Gate Process for VLSI Applications," pp. 1174–1179 (Seichi Iwata, Naoki Yamamoto, Nobuyoshi Kobayashi, Tomoyuki Terada, and Tatsumi Mizutani).

"A Novel Tungsten Gate Technology for VLSI Applications," pp. 94–95 (Nobuyoshi Kobayashi, Seichi Iwata, Naoki Yamamoto and Tomoyuki Terada).

1987 Materials Research Society "Highly Reliable Tungsten Gate Technology," pp. 159–167 (N. Kobayashi, S. Iwata, N. Yamamoto and N. Hara).

*Primary Examiner*—Charles Bowers
*Assistant Examiner*—Hsien Ming Lee
*Attorney, Agent, or Firm*—Jacqueline J. Garner; Wade James Brady; Richard L. Donaldson

[57] ABSTRACT

A metal-poly stack gate structure and associated method for forming a conductive barrier layer between W and poly in the metal-gate stack gate structure. The process includes the steps of depositing doped silicon on a substrate; forming nitride on the deposited silicon; depositing a metal on the nitride to form a metal/nitride/deposited silicon stack; and thermally treating the stack to transform the nitride into a conductive barrier layer between the metal and the deposited silicon. The thermal treatment transforms the nitride layer ($SiN_x$ or $SiN_xO_y$) into a conductive barrier ($WSi_xN_y$ or $WSi_xN_yO_z$) to form a W/barrier/poly stack gate structure. The barrier layer blocks reaction between W and Si, enhances sheet resistance, enhances adhesion between the W and the poly, and is stable at high temperatures.

27 Claims, 1 Drawing Sheet

STABLE AND LOW RESISTANCE METAL/BARRIER/SILICON STACK STRUCTURE AND RELATED PROCESS FOR MANUFACTURING

This application claims priority under 35 USC §119 (e) (1) of provisional application Ser. No. 60/051,798, filed Jul. 7, 1997.

FIELD OF THE INVENTION

This invention relates to semiconductor products and related processing, and more particularly to low resistance tungsten-poly gate structures and the process for making the same.

BACKGROUND OF THE INVENTION

A low-resistivity gate electrode is required to reduce speed limitations of MOS devices due to the gate RC delay time, especially in sub-quarter-micron ultra-large scale integrated circuits (ULSIs). Tungsten (W)-poly-silicon (poly) gate structures are known to have lower sheet resistance than conventional poly or policide gates. Because W reacts with poly at temperature as low as 600° C., it is critical to have a high quality diffusion barrier between the two materials. Tungsten nitride (WN) and Titanium Nitride (TiN) are known diffusion barriers between W and poly to avoid silicidation of the W film.

In conventional post-gate-etch dry/wet oxidation to remove the etch damage and to improve the gate dielectric strength, all metal material, including the barrier, is subjected to oxidation. However, under selective oxidation conditions, such as wet hydrogen oxidation (WHO), only Si is oxidized, while tungsten-based materials are not oxidized in post-gate-etch oxidation. The method is based on the thermodynamic control of the equilibrium:

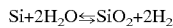

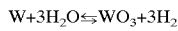

With proper control of $H_2O$ and $H_2$ partial pressure, the equilibrium for the first reaction is favored towards the right, while the second equilibrium prefers to go to the left. Therefore, under appropriate conditions it is possible to oxidize silicon (Si) while the oxidation rate of W is very small. On the other hand, the oxidation of TiN is much more favorable than the reduction of $TiO_2$, which makes the selective oxidation of W/TiN/Si system non-feasible. Therefore, considering the importance of low-resistivity and from a process integration point of view, a W-poly gate electrode without TiN is preferred.

Existing processes to fabricate W/WN/poly stack gate electrodes are based on a physical vapor deposition (PVD) process. For instance, $WN_x$ films are deposited on poly by reactive sputtering a W target in a gas mixture consisting of $Ar:N_2=1:1$. W films are then continuously deposited using a DC magnetron. However, the application of the above process to MOS devices with severe topography is limited due to the poor step coverage of PVD films. In addition, excess nitrogen in the $WN_x$ layer poses a potential problem for causing delamination as the gas may escape from the stack during subsequent thermal treatment. The typical process for depositing a diffusion barrier has a relatively low effective throughput, sometimes less than 20 wafers per hour.

There remains a need in the art for low-resistance W-poly gate structures and an effective and efficient process for forming barriers used in the W-poly gate structures.

SUMMARY OF THE INVENTION

The instant invention forms a requisite conductive barrier layer between W and poly in W-poly gate structures, and replaces existing barrier deposition processes. The inventive process for forming the W-poly gate includes the steps of depositing a silicon layer (with dopants) on a substrate; forming a silicon-containing nitride layer on the deposited silicon; depositing a metal on the nitride layer to form a metal/nitride/silicon stack; and thermally treating the stack to transform the nitride layer into a conductive barrier layer between the metal and the silicon. The thermal treatment transforms the nitride layer ($SiN_x$ or $SiN_xO_y$) into a conductive barrier ($WSi_xN_y$ or $WSi_xN_yO_z$) to form a W/barrier/poly stack gate structure. The oxygen (O) in the above-mentioned layers originates from the very thin native oxide of silicon if the deposited silicon is exposed to air prior to the subsequent steps.

The current invention provides an efficient and effective method for manufacturing stable and low resistance W-poly gates which overcomes prior art limitations, and also offers processing cost advantages.

Another advantage of the invention is that the process is time-efficient, with a resulting high effective throughput.

Another advantage of the invention is that the gate structures can use selective oxidation to remove etching damage to gate oxide.

Another advantage of the invention is the relatively low equipment cost required for running the process.

Another advantage of the invention is the reduced thermal budget as compared to existing W/WN/poly stack processes, which typically require an annealing step to drive out excess nitrogen.

A more complete appreciation of the present invention and its scope can be obtained from understanding the accompanying drawings, which are briefly summarized below, the following detailed description of the presently preferred embodiments of the invention, and the appended claims.

DETAILED DESCRIPTION OF THE INVENTION

Figure 1:
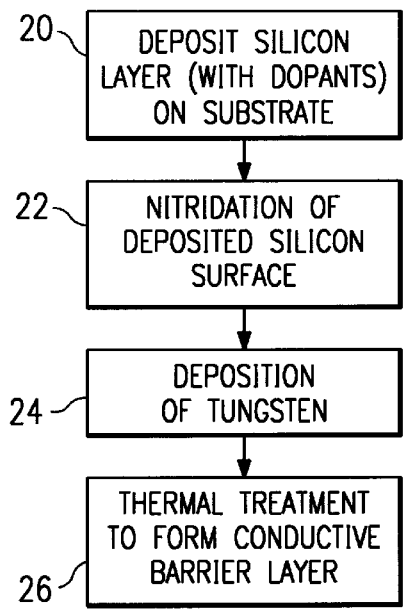
FIG. 1 is a flow chart representing the steps of the inventive process.

Referring to FIG. 1, the process flow of the inventive method is shown. In general, the preparation of a metal/barrier/silicon stack structure, such as a W-poly gate stack, begins with the step 20 of depositing a silicon layer (with dopants) on a substrate covered with a thin layer of dielectric (such as $SiO_x$ or $SiO_xN_y$). The deposited silicon layer is doped for gate applications. The dopants can be added during or after the deposition of the silicon layer. A nitridation step 22 is then performed to form a thin silicon nitride layer, such as $SiN_x$ or $SiN_xO_y$ on the deposited silicon surface. After the nitride layer is formed on the surface of the deposited silicon, step 24 is performed to deposit W to a desired thickness on the nitride surface. A thermal treatment step 26 is then performed to form the $WSi_xN_y$ or $WSi_xN_yO_z$ conductive barrier in the W/barrier/poly stack. The process of making the W/barrier/poly stack of the present invention is efficient, cost effective, and provides desirable barrier performance and sheet resistance in the resulting device. The inventive process is described in more detail below.

Figure 2:
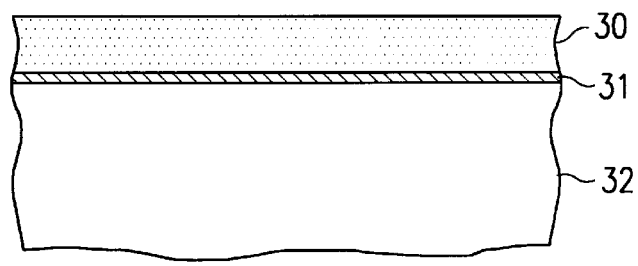
FIG. 2 is a schematic of a deposited silicon layer on a substrate covered by a thin dielectric layer.

The deposition of the silicon layer (with dopants) 30, often referred to as poly-silicon, on a thin dielectric layer 31 covered substrate 32 (such as silicon or other desired underlying material) can be performed by any known process. This stack structure is shown in FIG. 2.

Figure 3:
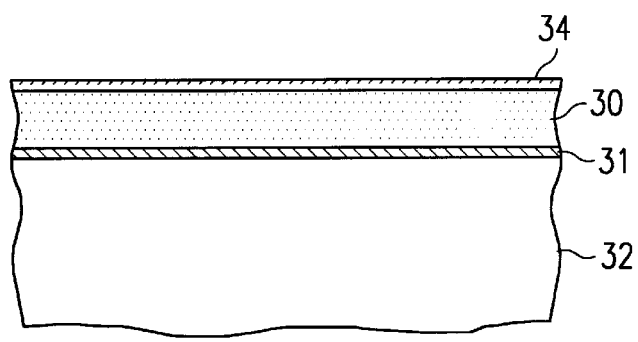
FIG. 3 is a schematic similar to FIG. 2, showing a nitride layer on the deposited silicon layer.

The step 22 of forming a nitride layer 34 ($SiN_x$ or $SiN_xO_y$) on the surface of the deposited silicon 30 is next performed. This stack structure is shown in FIG. 3. This step can be performed in the same cluster tool as the poly-silicon deposition chamber. If it is not performed in the same cluster tool as the poly-silicon deposition, such as if the step is performed in the W deposition chamber, an optional wet etching step (such as using diluted HF solution) is suggested to minimize the thickness of the native oxide that forms on the deposited silicon surface. The nitride is formed to a thickness in the range of approximately 5 to 30 Å thick, preferably 15 Å. These nitride thicknesses have been found to form an effective barrier in the W-deposited silicon gate structure, and to provide the desired performance characteristics.

The nitridation step 22 can be performed using $N_2/H_2$ plasma, $NH_3$ plasma, rapid thermal nitridation, or by subjecting the wafer to other active nitrogen-containing ambient gases. An acceptable manner of performing this step is in a CVD reactor with an RF powered electrode for plasma nitridation using $N_2/H_2$ plasma. For instance, an Applied Materials Model P-5000, which is normally used for W deposition, would be suitable. Typical processing parameters for the nitridation step using $N_2/H_2$ plasma are: $N_2$ flow between approximately 100 and 1000 sccm, $H_2$ flow between approximately 100 and 1000 sccm, susceptor temperature between approximately 300 and 500° C., reactor pressure between approximately 0.1 and 5 torr, and plasma power between approximately 200 and 500W, all for a time between approximately 5 and 60 seconds. The resulting silicon nitride layer formed is between approximately 5 Å and 30 Å thick. Preferably, the processing parameters for the nitridation step using $N_2/H_2$ plasma are: $N_2$ flow of 500 sccm, $H_2$ flow of 500 sccm, susceptor temperature of 360° C., reactor pressure of 4 torr, plasma power of 400 W, for a time of 15 seconds. The resulting nitride layer is preferably 15 Å thick.

Alternatively, typical processing parameters for the nitridation step using an $N_2/NH_3$ plasma, in a reactor similar to the one mentioned above, are: $N_2$ flow between approximately 100 and 1000 sccm, $NH_3$ flow between approximately 50 and 500 sccm, susceptor temperature between approximately 300 and 500° C., reactor pressure between approximately 0.1–5 torr, plasma power between approximately 100 and 500W, all for a time between approximately 5 and 60 seconds. The resulting silicon nitride layer formed is between approximately 5 Å and 30 Å thick. Preferably, the processing parameters for the nitridation step using $N_2/NH_3$ plasma are: $N_2$ flow of 100 sccm, $NH_3$ flow of 300 sccm, susceptor temperature of 360° C., reactor pressure of 0.6 torr, plasma power of 200 W, for a time of 15 seconds. The resulting nitride layer is preferably 15 Å thick.

Still alternatively, the nitrogen source in the nitridation step could be $CH_3NHNH_2$, $N_2H_4$ or other nitrogen-containing compounds. When these more reactive sources are used, plasma enhancement is not necessary because the nitridation can be performed thermally. Alternatively, the nitridation step can be replaced by depositing a thin layer of $SiN_x$ or $SiN_xO_y$ to a depth of between approximately 5 and 30 Å, preferably 15 Å.

Figure 4:
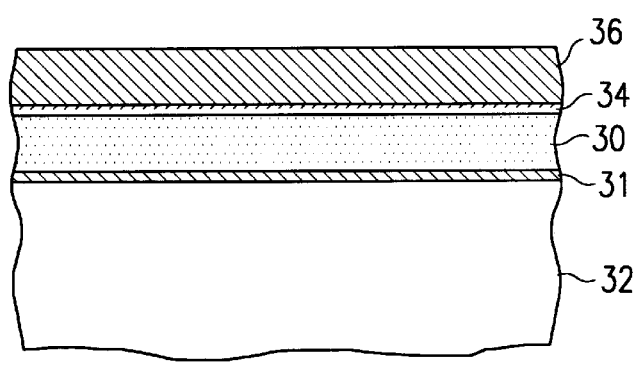
FIG. 4 is a schematic similar to FIG. 3, showing a tungsten layer (W) on the nitride layer.
Figure 5:
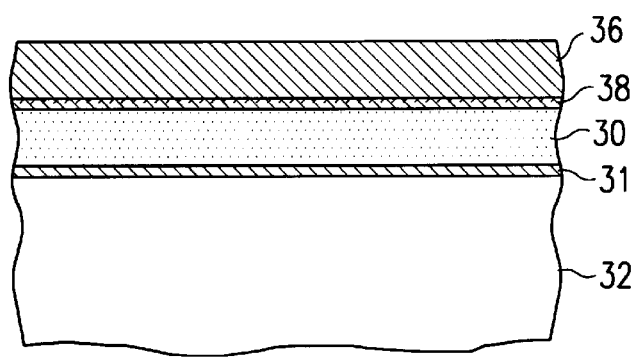
FIG. 5 is a schematic similar to FIG. 4 after heat treatment, where the nitride layer has transformed into a conductive barrier layer between the W and the deposited silicon layer.

After the nitridation step as set forth above, step 24 for depositing W 36 on the top of the thin nitride layer 34 is performed. The thickness of the deposited W ranges between approximately 300 and 3,000 Å, depending on the particular device being built. This stack structure is shown in FIG. 4. The W deposition step can be performed either in the same chamber or a different chamber as used for the nitridation step. Preferably, an in-situ process (performing the W deposition step in the same chamber as the nitridation step without venting to atmosphere) is preferred due to higher throughput. The W deposition can be performed with any known process by thermal CVD, plasma-enhanced CVD (PECVD), or PVD. An acceptable W deposition process uses PECVD with $WF_6+H_2+Ar$ gas mixtures. Typical processing parameters for W deposition are: $WF_6$ flow between approximately 2 and 6 sccm, $H_2$ flow between approximately 100 and 1000 sccm, Ar flow between approximately 100 and 1000 sccm, susceptor temperature between approximately 300 and 500° C., reactor pressure between approximately 1 and 10 torr and plasma power between approximately 100 and 500W, all for a time of between approximately 45 seconds and 3 minutes. Preferably, processing parameters for PECVD W deposition are: $WF_6$ flow of 3 sccm, $H_2$ flow of 500 sccm, Ar of 500 sccm, susceptor temperature of 360° C., reactor pressure of 5 torr and plasma power of 375W, for a time of 120 seconds. The resulting thickness is about 700 Å.

Other types of refractory metals can be used in place of W. Molybdenum (Mo) and tantalum (Ta) are suitable refractory metals that can alternatively be used, depending on the desired performance of the resulting device. Mo and Ta also form amorphous conductive barrier layers after thermal treatment, similar to that formed by W. The conductive layers formed are $MoSi_xN_y$ or $MoSi_xN_yO_z$, and $TaSi_xN_y$ or $TaSi_xN_yO_z$, respectively.

After the deposition of W, thermal treatment step 26 is performed to transform the nitride layer 34 ($SiN_x$ or $SiN_xO_y$) to an amorphous conductive barrier layer 38 ($WSi_xN_y$ or $WSi_xN_yO_z$) between the W 36 and the deposited silicon 30 layers. This thermal step is performed by rapid thermal annealing at 800–950° C. for approximately 15–90 seconds. Alternatively, this thermal step can be performed in a furnace under a non-oxidizing environment, such as $N_2$, Ar or forming gas (5% $H_2$/95% $N_2$), in the temperature range of approximately 700–950° C. for approximately 5 to 30 minutes. An in-situ thermal annealing process provides for higher throughput, but also requires more expensive equipment. After the thermal treatment, the conductive barrier 38 is generally thicker than the nitride layer 34. For instance, where the nitride layer 34 is approximately 15 Å thick, the resulting conductive barrier layer 38 is approximately 30 Å thick.

The conductive barrier 38 formed between the W 36 and the poly 30 during the thermal treatment step 26 of the inventive process has a high thermal stability which provides a very effective diffusion barrier, is small in dimension, and assists in creating a low sheet resistance for the gate structure. The $WSi_xN_y$ or $WSi_xN_yO_z$ is an effective barrier because of its amorphous structure and high thermal stability. In testing, the interface structure showed no evidence of W—Si inter-diffusion after annealing at 850° C. for 30 minutes. In addition, the barrier structure enhances adhesion between W and the poly as indicated qualitatively by tape-peel testing. The W/WSi$_x$N$_y$O$_z$/deposited silicon stack formed by the inventive process of the present invention can use selective oxidation, while the W/TiN/deposited silicon cannot.

After the W/poly gate structure stack is formed as set forth above, known processing can be performed to pattern and etch the W/poly stack structure into the desired pattern for subsequent processing towards the end goal of manufacturing a complete and functional semiconductor device.

The W-poly gate structure manufacturing process described herein is useful for manufacturing a wide range of microelectronic devices that require metal-poly gates. An example of such applications is the fabrication of low-resistance wordlines for DRAM devices and gates for CMOS logic devices.

Presently preferred embodiments of the present invention and many of its improvements have been described with a degree of particularity. It should be understood that this description is made by way of preferred example, and that the invention is defined by the scope of the following claims.

What is claimed is:

1. A method for forming a metal/barrier/silicon stack structure in a semiconductor device comprising the steps of:
   depositing a silicon layer on a substrate;
   forming a silicon-containing nitride layer on the deposited silicon;
   depositing a metal layer on the silicon-containing nitride layer to form a metal/nitride/silicon stack; and
   thermally treating the stack to transform the silicon containing nitride into a conductive barrier layer between the metal and the deposited silicon.

2. A method as defined in claim 1 using a chamber, wherein the silicon layer deposition step and the silicon containing nitride formation step are performed in the same chamber.

3. A method as defined in claim 1 using a chamber, wherein the silicon containing nitride formation step and the metal deposition step are performed in the same chamber.

4. A method as defined in claim 1, wherein the metal is tungsten.

5. A method as defined in claim 4, wherein the metal layer deposition step is achieved through PECVD using a gas mixture of WF$_6$+H$_2$+Ar.

6. A method as defined in claim 4, wherein the stack is used in forming a tungsten-poly gate structure.

7. A method as defined in claim 1, wherein the metal is molybdenum.

8. A method as defined in claim 7, wherein the conductive barrier is MoSi$_x$N$_y$.

9. A method as defined in claim 7, wherein the conductive barrier is MoSi$_x$N$_y$O$_z$.

10. A method as defined in claim 1, wherein the metal is tantalum.

11. A method as defined in claim 10, wherein the conductive barrier is TaSi$_x$N$_y$.

12. A method as defined in claim 10, wherein the conductive barrier is TaSi$_x$N$_y$O$_z$.

13. A method as defined in claim 1, wherein the silicon-containing nitride formation step is performed using an N$_2$/H$_2$ plasma.

14. A method as defined in claim 13, wherein the chamber is adapted to receive gas flows, wherein the N$_2$ flow is between 100 and 1000 sccm, and the H$_2$ flow is between 100 and 1000 sccm.

15. A method as defined in claim 13 using a susceptor, wherein the susceptor temperature is between approximately 300 and 500° C.

16. A method as defined in claim 1, wherein the silicon containing nitride formation step is performed using an N2/NH3 plasma.

17. A method as defined in claim 16, wherein the chamber is adapted to receive gas flows, wherein the N$_2$ flow is between 100 and 1000 sccm, and the NH$_3$ flow is between 50 and 500 sccm.

18. A method as defined in claim 16 using a susceptor, wherein the susceptor temperature is between approximately 300 and 500° C.

19. A method as defined in claim 1, wherein the barrier thickness is approximately 30 Å.

20. A method as defined in claim 1, wherein the silicon-containing nitride layer formation step is performed by thermal nitridation using NH$_3$.

21. A method as defined in claim 1, wherein the silicon-containing nitride layer formation step is performed by thermal nitridation using CH$_3$NHNH$_2$.

22. A method as defined in claim 1, wherein the silicon-containing nitride layer formation step is performed by thermal nitridation using N$_2$H$_4$.

23. A method as defined in claim 1, wherein the silicon-containing nitride is SiN$_x$.

24. A method as defined in claim 23, wherein the conductive barrier is WSi$_x$N$_y$.

25. A method as defined in claim 1, wherein the silicon-containing nitride is SiN$_x$O$_y$.

26. A method as defined in claim 25, wherein the conductive barrier is WSi$_x$N$_y$O$_z$.

27. A method as defined in claim 1 using a cluster tool having two chambers, wherein the silicon containing nitride layer formation step and the metal deposition step are performed in different chambers of the same cluster tool.

* * * * *

UNITED STATES PATENT AND TRADEMARK OFFICE
CERTIFICATE OF CORRECTION

PATENT NO: 6,100,188
DATED: August 8, 2000
INVENTOR(S): Jiong-Ping Lu, Ming Hwang, Dirk N. Anderson, Duane E. Carter, and Wei-Yung Hsu It is certified that error appears in the above-identified patent and that said Letters Patent are hereby corrected as shown below:

On the face of this patent, please insert the following after "[75] Inventors:"

Jiong-Ping Lu; Ming Hwang, both of Dallas; Dirk N. Anderson; Duane E. Carter, both of Plano; Wei-Yung Hsu, Dallas, all of Tex.

Signed and Sealed this

Seventeenth Day of April, 2001

*Attest:*

NICHOLAS P. GODICI

*Attesting Officer*   Acting Director of the United States Patent and Trademark Office